(12) United States Patent
Itoh et al.

(10) Patent No.: US 9,892,852 B2
(45) Date of Patent: Feb. 13, 2018

(54) INDUCTOR MANUFACTURING METHOD

(71) Applicant: FUJITSU LIMITED, Kawasaki-shi, Kanagawa (JP)

(72) Inventors: Masayuki Itoh, Kawasaki (JP); Hiroshi Kurosawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 248 days.

(21) Appl. No.: 14/834,635

(22) Filed: Aug. 25, 2015

(65) Prior Publication Data

US 2016/0141101 A1  May 19, 2016

(30) Foreign Application Priority Data

Nov. 13, 2014 (JP) ................................ 2014-231077

(51) Int. Cl.
```
H01F 41/04    (2006.01)
C25D 5/00     (2006.01)
H05K 3/18     (2006.01)
C25D 21/12    (2006.01)
```

(52) U.S. Cl.
CPC ......... *H01F 41/041* (2013.01); *H01F 41/042* (2013.01); *C25D 5/00* (2013.01); *C25D 21/12* (2013.01); *H05K 3/181* (2013.01)

(58) Field of Classification Search
CPC .... H01F 41/041; H01F 41/042; H01F 41/043; H01F 41/045; H01F 41/046; H05K 3/10; H05K 3/181; H05K 3/182; H05K 3/187; H05K 3/188; H05K 3/241; C25D 5/00; C25D 21/12–21/22

USPC ............ 336/200, 232; 205/125, 126, 81–84; 204/232–241, 228.7, 229.3
See application file for complete search history.

(56) References Cited

U.S. PATENT DOCUMENTS

| 4,560,445 A * | 12/1985 | Hoover ..................... C25D 5/02 205/126 |
| 2006/0017539 A1* | 1/2006 | Lee ...................... H01F 17/0006 336/200 |
| 2006/0141157 A1* | 6/2006 | Sekimoto ................ C25D 5/022 427/282 |
| 2013/0293337 A1* | 11/2013 | Lo ............................ H01F 5/003 336/200 |
| 2014/0230855 A1* | 8/2014 | Mayer ................. G01N 21/9501 134/18 |

FOREIGN PATENT DOCUMENTS

JP     08-213740 A     8/1996

* cited by examiner

*Primary Examiner* — Peter DungBa Vo
*Assistant Examiner* — Joshua D Anderson
(74) *Attorney, Agent, or Firm* — Squire Patton Boggs (US) LLP

(57) ABSTRACT

A method of manufacturing an inductor, includes: forming a coil pattern on a substrate by forming a conductive pattern on the substrate then growing the conductive pattern by plating; removing, if a plating residue is adhering to the coil pattern, the plating residue from the coil pattern; and outputting a cleaning request alarm that requests a plating bath to be cleaned if a number of times the plating residue has been removed or an amount of plating residue that has been removed exceeds a first threshold.

5 Claims, 17 Drawing Sheets

INDUCTOR MANUFACTURING METHOD

CROSS-REFERENCE TO RELATED APPLICATION

This application is based upon and claims the benefit of priority of the prior Japanese Patent Application No. 2014-231077, filed on Nov. 13, 2014, the entire contents of which are incorporated herein by reference.

FIELD

The embodiment discussed herein is related to, for example, a method of manufacturing an inductor.

BACKGROUND

As mobile telephones, smart phones, tablet personal computers (PCs), and other mobile devices have had more functions, inductors (coil parts) used in these devices are desirable to be more compact in recent years.

A thin-film inductor is known as an inductor having a structure that may make the inductor compact. To form a thin-film inductor, a coil pattern is formed on a substrate by forming a conductive pattern on the substrate with a conductor such as a copper material and then growing the conductive pattern by plating. In this structure, the cross-sectional area of the coil pattern is increased by plating, reducing its resistance. As a result, the current capacity of the coil may be increased, enabling the device to be more efficient. A related technology is disclosed in, for example, Japanese Laid-open Patent Publication No. 8-213740.

SUMMARY

In accordance with an aspect of the embodiments, a method of manufacturing an inductor, includes: forming a coil pattern on a substrate by forming a conductive pattern on the substrate then growing the conductive pattern by plating; removing, if a plating residue is adhering to the coil pattern, the plating residue from the coil pattern; and outputting a cleaning request alarm that requests a plating bath to be cleaned if a number of times the plating residue has been removed or an amount of plating residue that has been removed exceeds a first threshold.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

These and/or other aspects and advantages will become apparent and more readily appreciated from the following description of the embodiments, taken in conjunction with the accompanying drawing of which.

DESCRIPTION OF EMBODIMENT

An embodiment of the present disclosure will be described with reference to the drawings.

First Embodiment

Figure 1:
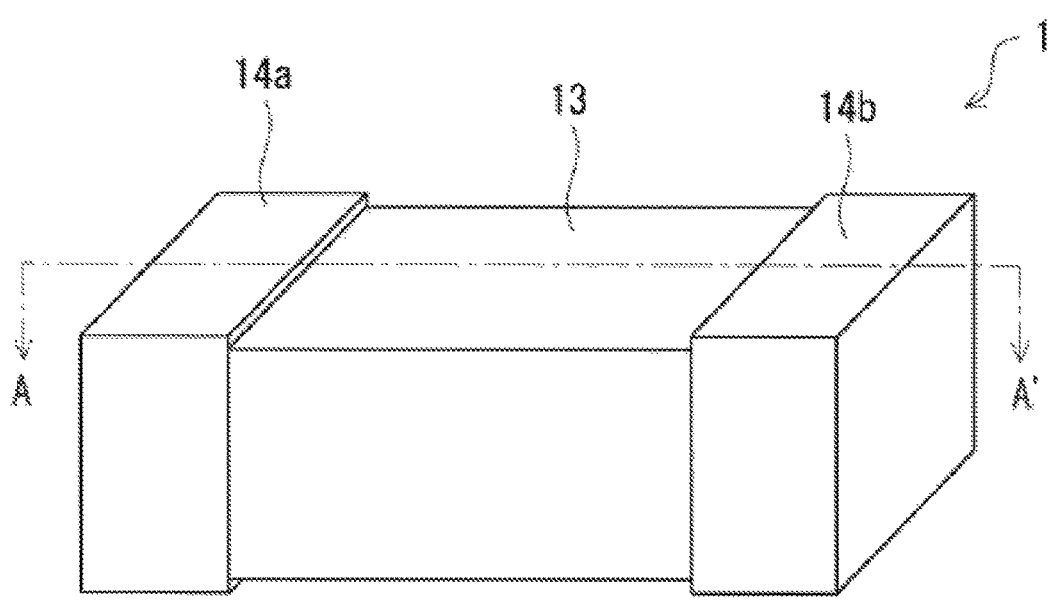
FIG. 1 is a perspective view illustrating the outside shape of an inductor in an embodiment.
Figure 2:
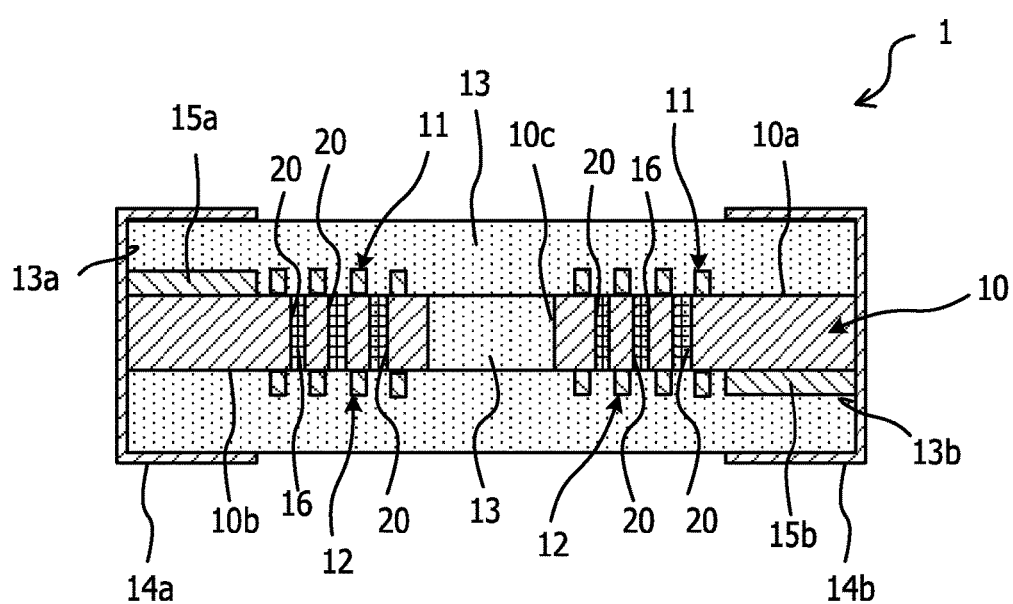
FIG. 2 is a cross-sectional view taken along line II-II in FIG. 1.

FIG. 1 is a perspective view illustrating the outside shape of an inductor 1 in a first embodiment. The inductor 1, which is also referred to as a coil, is a chip part. FIG. 2 is a cross-sectional view taken along line II-II in FIG. 1. The inductor 1 includes an insulated substrate 10, a first coil pattern 11, which is a conductor formed on the upper surface 10a of the insulated substrate 10, a second coil pattern 12, which is a conductor formed on the lower surface 10b of the insulated substrate 10, an exterior core 13, and a pair of external electrodes 14a and 14b, and the like.

Figure 3:
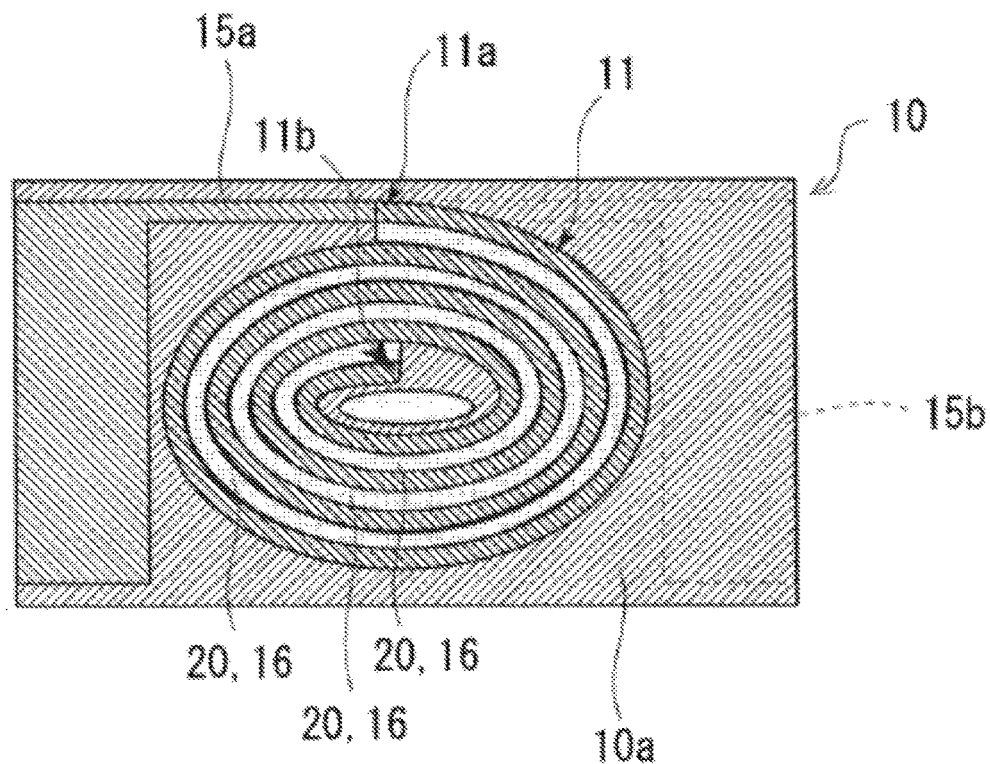
FIG. 3 is a plan view of an insulated substrate in the embodiment.
Figure 4:
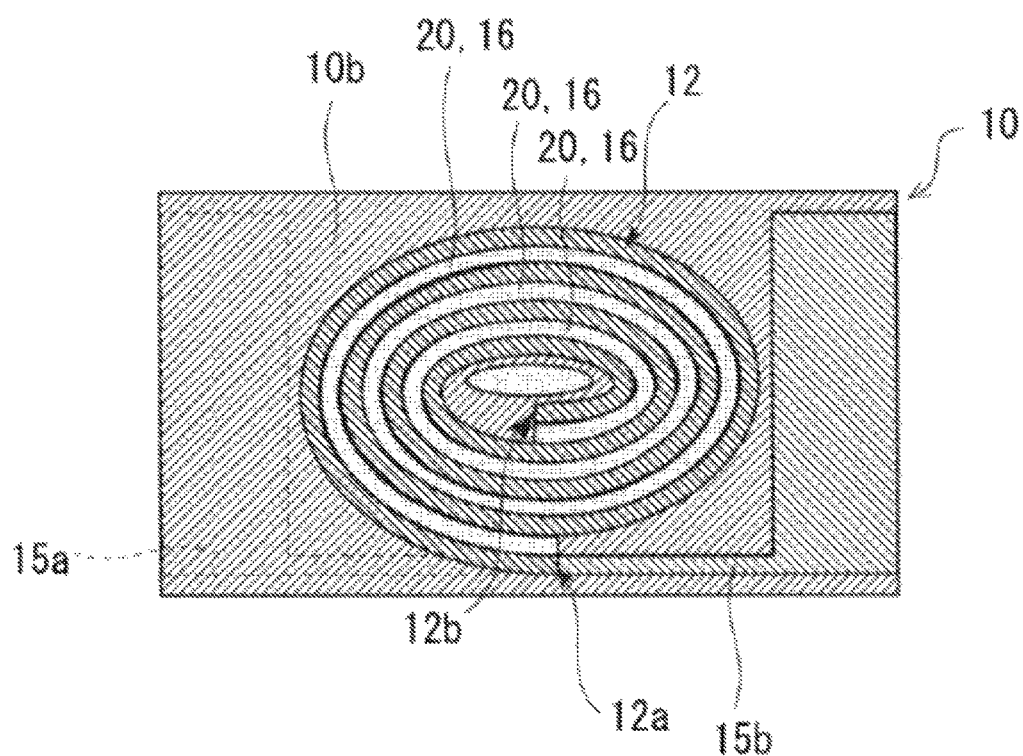
FIG. 4 is a bottom view of the insulated substrate in the embodiment.

The insulated substrate 10 is, for example, an insulating resin substrate. FIG. 3 is a plan view of the insulated substrate 10 when viewed from the same side as the upper surface 10a. FIG. 4 is a bottom view of the insulated substrate 10 when viewed from the same side as the lower surface 10b. As illustrated in FIG. 3, the insulated substrate 10 has a substantially rectangular plane. At its central portion, a substantially elliptical opening 10c is formed. The opening 10c passes through the insulated substrate 10 in its thickness direction.

The insulated substrate 10 is a substrate on which to form the first coil pattern 11 and second coil pattern 12. As illustrated in FIGS. 3 and 4, the first coil pattern 11 and second coil pattern 12 have a spiral shape (like an eddy or a loop) in a plan view. In the examples in these drawings, the first coil pattern 11 and second coil pattern 12 each have four turns, but the number of turns is not limited to a particular number. The first coil pattern 11 and second coil pattern 12 are formed by forming a spiral pattern with a conductor and then growing the pattern by plating, so an adequate conductor thickness may be obtained. Accordingly, since the resistances of the coils may be reduced, the current capacities of the coils may be increased and the device may be made to be highly efficient.

Although the first coil pattern 11 and second coil pattern 12 in this embodiment have an elliptical spiral shape as illustrated in FIGS. 3 and 4, they may have, for example, a circular or rectangular spiral shape or another shape. The first coil pattern 11 and second coil pattern 12 are placed so as to enclose the opening 10c in the insulated substrate 10. The first coil pattern 11 and second coil pattern 12 coincide with each other in a plan view.

The first coil pattern 11 has a clockwise spiral shape that starts from an outer circumferential end 11a and extends to an inner circumferential end 11b when viewed from the same side as the upper surface 10a of the insulated substrate 10. The second coil pattern 12 has a clockwise spiral shape that starts from an outer circumferential end 12a and extends to an inner circumferential end 12b when viewed from the same side as the lower surface 10b of the insulated substrate 10. The inner circumferential end 11b of the first coil pattern 11 and inner circumferential end 12b of the second coil pattern 12 are electrically interconnected through a through-hole conductor (not illustrated), which passes through the insulated substrate 10.

The insulated substrate 10, which includes the first coil pattern 11 and second coil pattern 12, is covered with the exterior core 13. The exterior core 13 is, for example, a magnetic material-containing resin. The magnetic material-containing resin is a magnetic material formed by, for example, mixing a metallic magnetic powder into a resin. The resin included in the magnetic material-containing resin functions as, for example, an insulative binder. The material of the resin may be, for example, a liquid epoxy resin or a powder epoxy resin. Although, in the example in FIG. 1, the exterior core 13 has a substantially rectangular parallelepiped shape, it may have another shape. The surfaces of the exterior core 13 may be covered with insulative films (not illustrated).

As illustrated in FIG. 1, a pair of external electrodes 14a and 14b are formed at both ends of the inductor 1 (exterior core 13). The outer circumferential end 11a of the first coil pattern 11 is led out to a side surface 13a of the exterior core 13 by a first leading electrode 15a and is connected to an external electrode 14a through the first leading electrode 15a. The outer circumferential end 12a of the second coil pattern 12 is led out to another side surface 13b of the exterior core 13 by a second leading electrode 15b and is connected to another external electrode 14b through the second leading electrode 15b.

As illustrated in FIG. 2, a trimming through-hole 20, which passes through the insulated substrate 10 in its thickness direction, is formed in the insulated substrate 10 in the inductor 1. As illustrated in FIGS. 3 and 4, the trimming through-hole 20 is located between the adjacent conductors of the first coil pattern 11 and second coil pattern 12 on the insulated substrate 10, that is, between each two spiral turns. In other words, the trimming through-hole 20 is spirally formed along the first coil pattern 11 and second coil pattern 12. After the manufacturing of the inductor 1 has been completed, the trimming through-hole 20 is filled with an insulating resin 16. The trimming through-hole 20 will be described later in detail. The trimming through-hole 20 may not be filled with the insulating resin 16. Upon the completion of the manufacturing of the inductor 1, the trimming through-hole 20 may be hollow.

Figure 5:
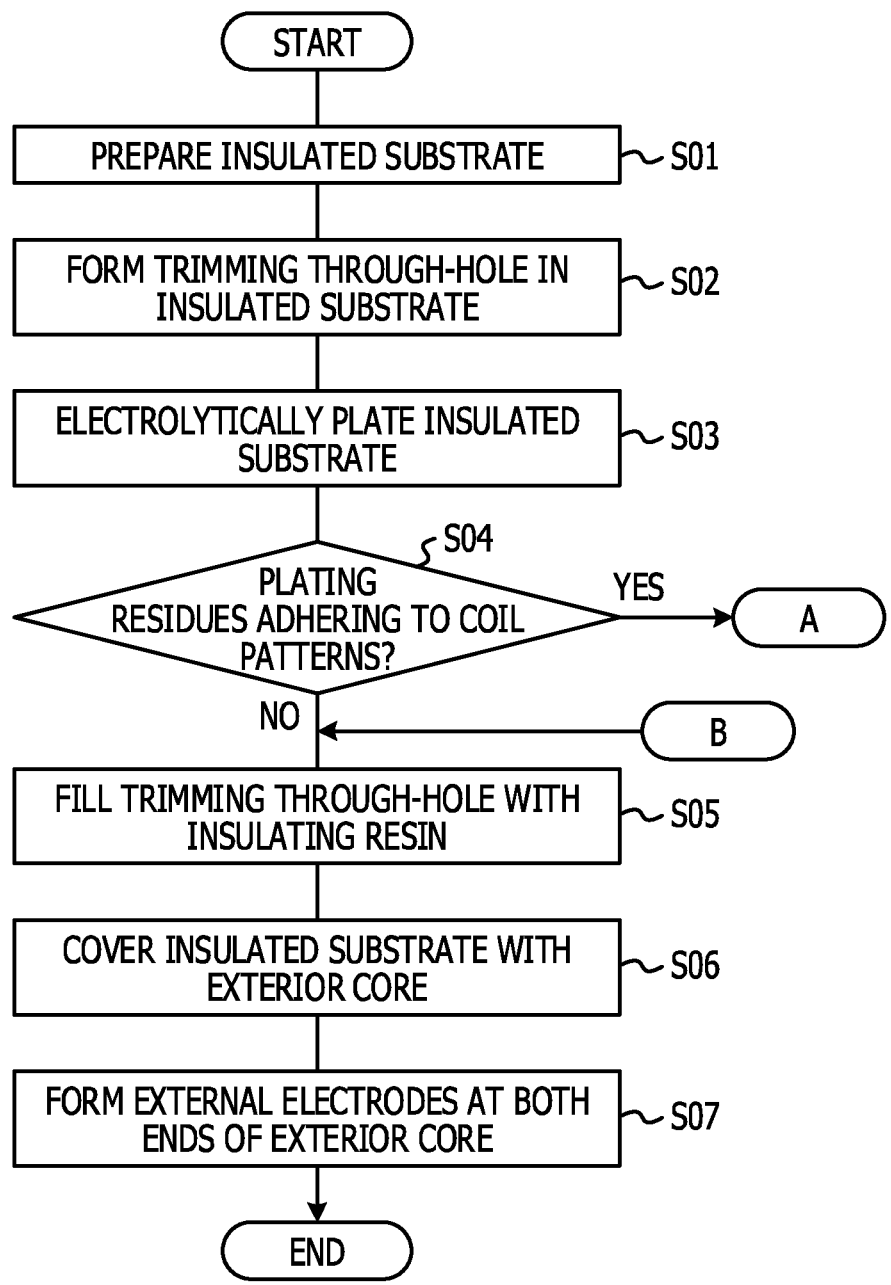
FIGS. 5 and 6 are a flowchart illustrating steps of manufacturing the inductor in the embodiment.
Figure 6:
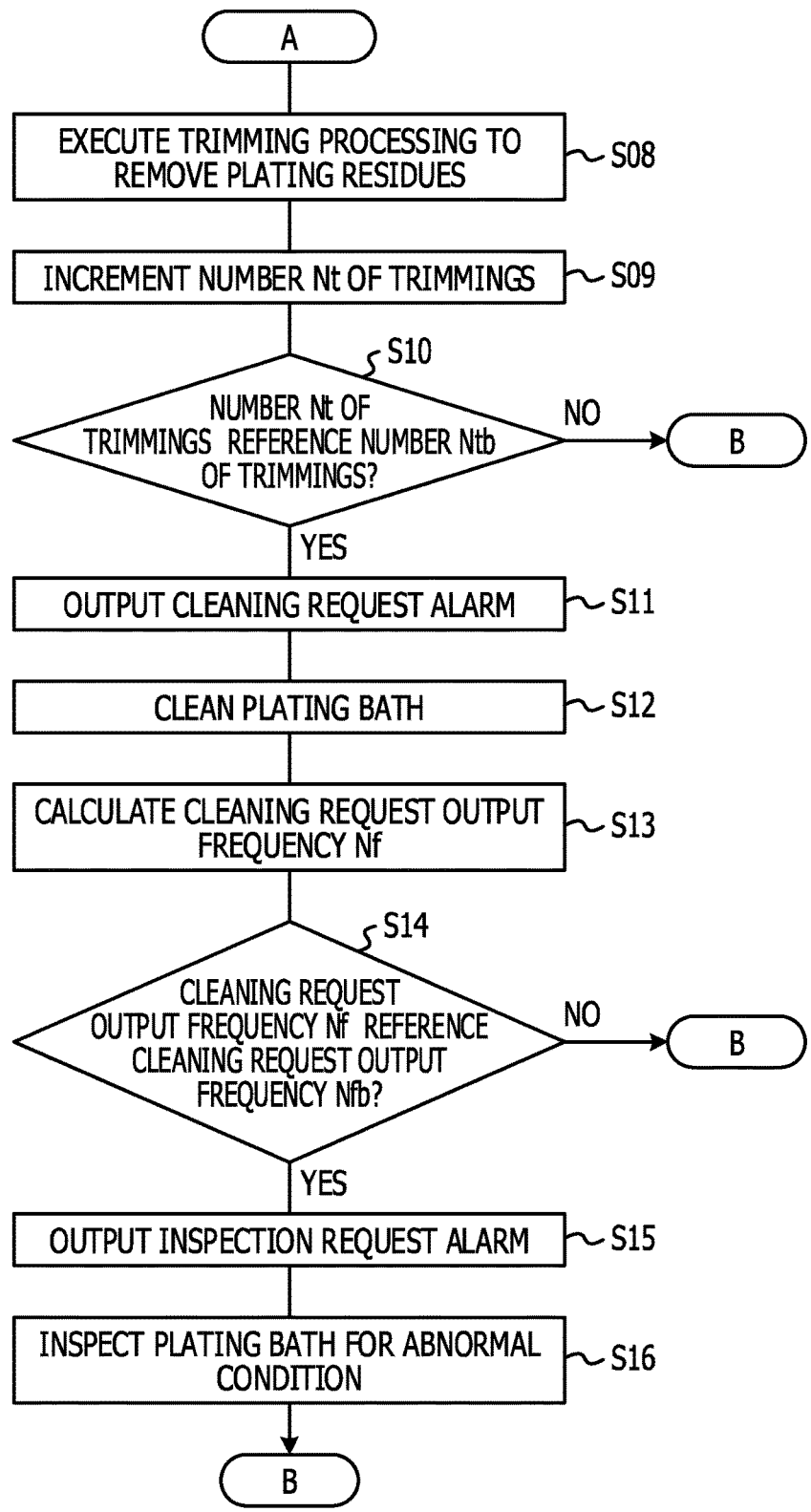
Figure 7:
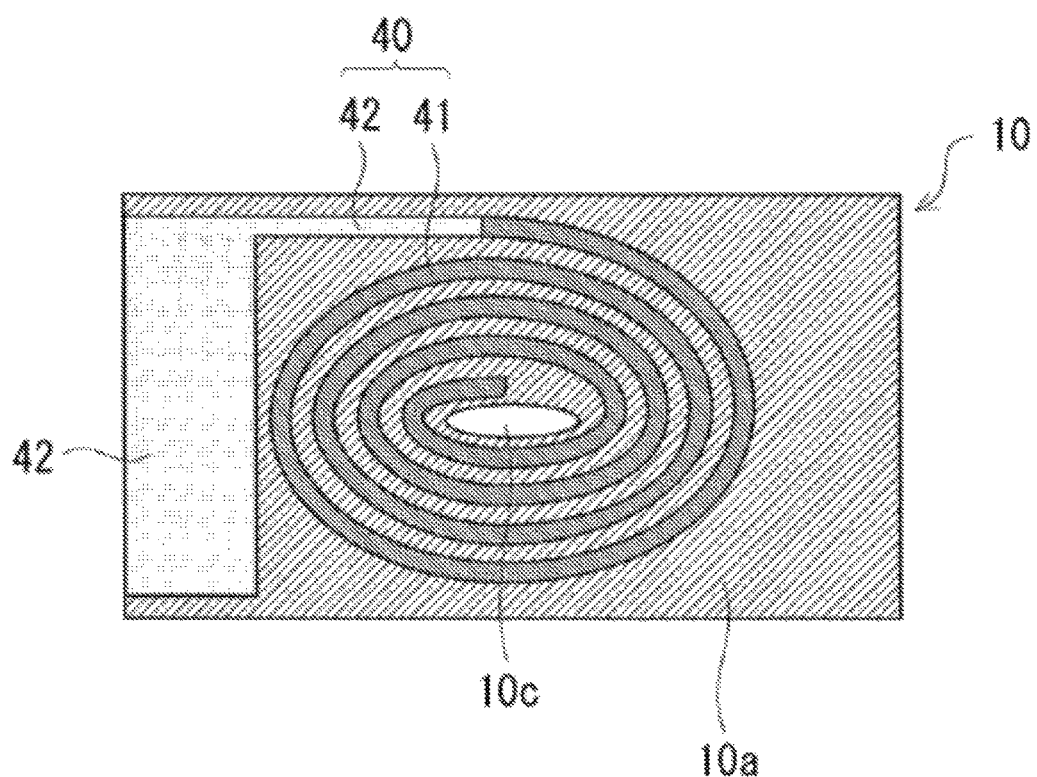
FIG. 7 illustrates a step of manufacturing the inductor in the embodiment.
Figure 8:
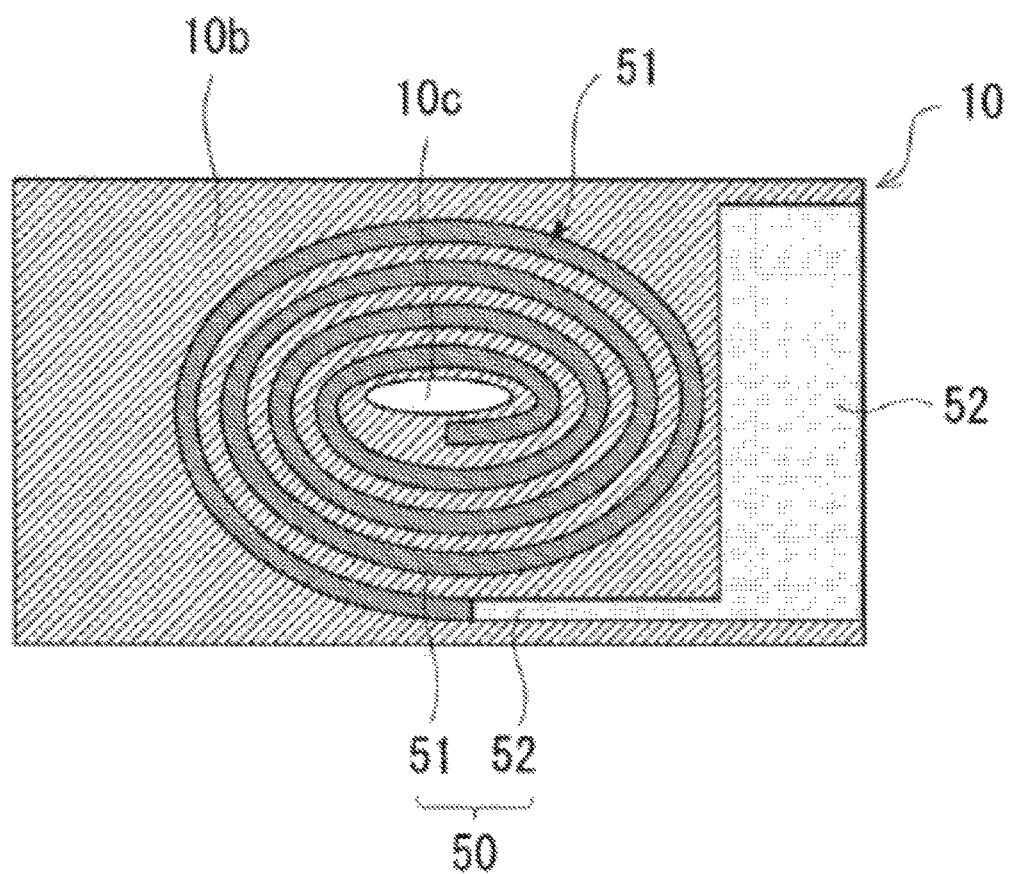
FIG. 8 illustrates another step of manufacturing the inductor in the embodiment.

Next, steps of manufacturing the inductor 1 in this embodiment will be described. FIGS. 5 and 6 are a flowchart illustrating steps of manufacturing the inductor 1. First, the insulated substrate 10 in which the opening 10c and a through-hole (not illustrated) are formed at predetermined positions is prepared as illustrated in FIGS. 7 and 8 (S01 in FIG. 5). FIG. 7 illustrates the upper surface 10a of the insulated substrate 10, a first conductive pattern 40 having been formed on the upper surface 10a. FIG. 8 illustrates the lower surface 10b of the insulated substrate 10, a second conductive pattern 50 having been formed on the lower surface 10b. The first conductive pattern 40 has been formed on the upper surface 10a of the insulated substrate 10. The second conductive pattern 50 has been formed on the lower surface 10b of the insulated substrate 10. The first conductive pattern 40 includes a first spiral conductor 41 and a first leading electrode conductor 42. The second conductive pattern 50 includes a second spiral conductor 51 and a second leading electrode conductor 52.

In the example illustrated in FIG. 7, the first spiral conductor 41 has an elliptical spiral shape. When the first spiral conductor 41 is plated, the first coil pattern 11 illustrated in FIG. 3 is grown. When the first leading electrode conductor 42 is plated, the first leading electrode 15a illustrated in FIG. 3 is grown. In the example illustrated in FIG. 8, the second spiral conductor 51 has an elliptical spiral shape. When the second spiral conductor 51 is plated, the second coil pattern 12 illustrated in FIG. 4 is grown. When the second leading electrode conductor 52 is plated, the second leading electrode 15b illustrated in FIG. 4 is grown. The first spiral conductor 41 and second spiral conductor 51 have the same spiral shape in a plan view; these spiral shapes vertically coincide with each other.

In this embodiment, the first conductive pattern 40 and second conductive pattern 50 are formed with copper (Cu). For example, they are formed by forming a copper base film over substantially all surfaces of the insulated substrate 10 by an electroless plating method. At this time, a copper film is formed in a through-hole (not illustrated) in the insulated substrate 10. The through-hole is located at a position corresponding to the inner circumferential ends of the first spiral conductor 41 and second spiral conductor 51, so the first spiral conductor 41 and second spiral conductor 51 are electrically interconnected through the through-hole. After that, when photoresists are exposed to light and developed, for example, the first conductive pattern 40 and second conductive pattern 50 may be formed.

Figure 9:
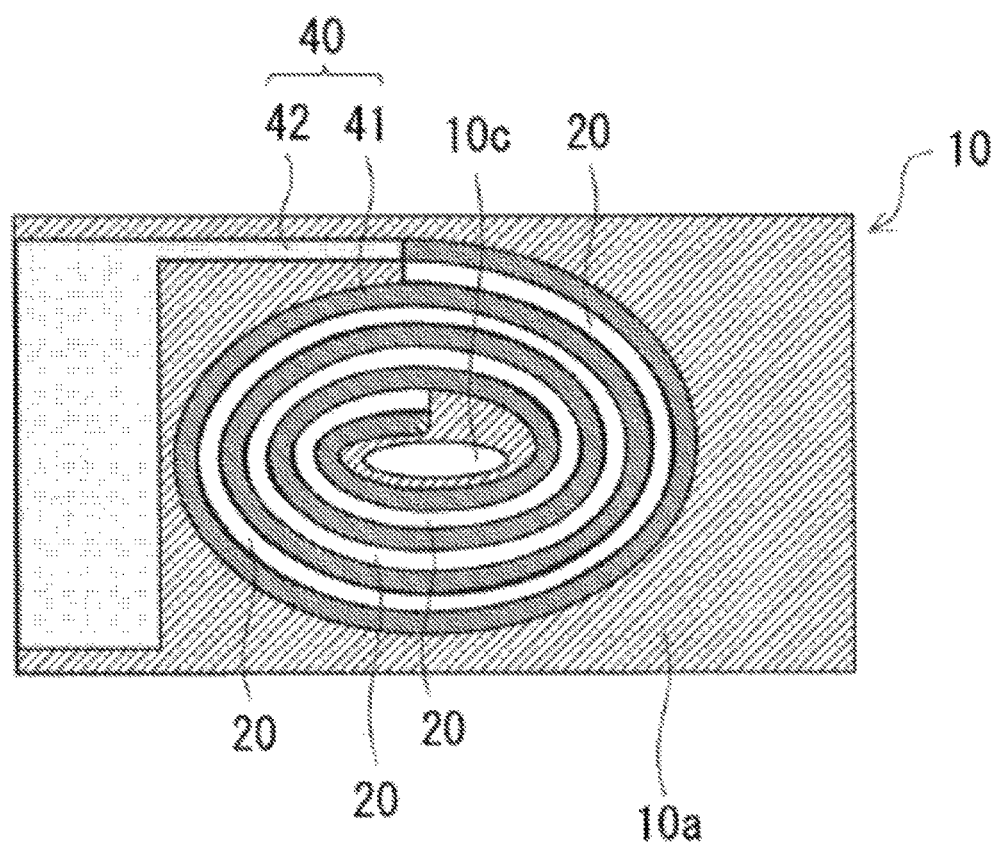
FIG. 9 illustrates another step of manufacturing the inductor in the embodiment.

Next, the trimming through-hole 20 is formed in the insulated substrate 10 as illustrated in FIG. 9 (S02 in FIG. 5). FIG. 9 illustrates the insulated substrate 10 when viewed from the same side as the upper surface 10a. The trimming through-hole 20 in FIG. 9 may be formed by, for example, laser machining in which a carbon dioxide ($CO_2$) laser or the like is used. The trimming through-hole 20 is formed as a through-hole that is located between the adjacent conductors (between each two turns) of the first spiral conductor 41 and second spiral conductor 51 on the insulated substrate 10 and has a spiral plane shape.

Figure 10:
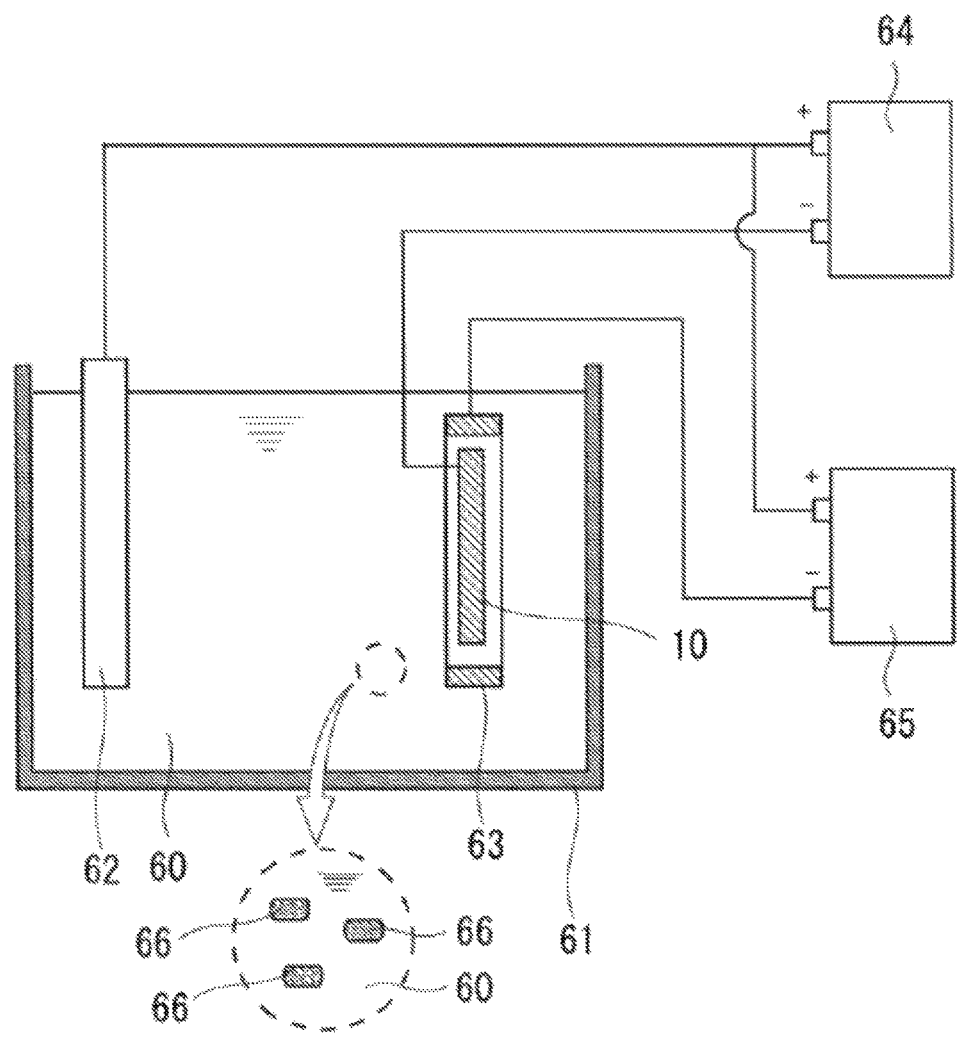
FIG. 10 illustrates a plating bath in the embodiment.

Next, a plating bath 61, as illustrated in FIG. 10, in which a plating liquid 60 is stored is prepared, after which the insulated substrate 10 is immersed in the plating liquid 60 and is electrolytically plated to grow the first conductive pattern 40 and second conductive pattern 50 by plating (S03 in FIG. 5). Due to electrolytic plating in which the plating bath 61 is used, the first spiral conductor 41 and first leading electrode conductor 42 of the first conductive pattern 40 are grown by plating. As a result, the first coil pattern 11 and first leading electrode 15a are formed on the upper surface 10a of the insulated substrate 10 (see FIG. 3). When the second spiral conductor 51 and second leading electrode conductor 52 of the second conductive pattern 50 are grown by plating, the second coil pattern 12 and second leading electrode 15b are formed on the lower surface 10b of the insulated substrate 10 (see FIG. 4). In FIG. 10, the reference numeral 62 indicates an anode, the reference numeral 63 indicates an auxiliary electrode, the reference numeral 64 indicates a substrate power supply, and the reference numeral 65 indicates an auxiliary electrode power supply.

Figure 11:
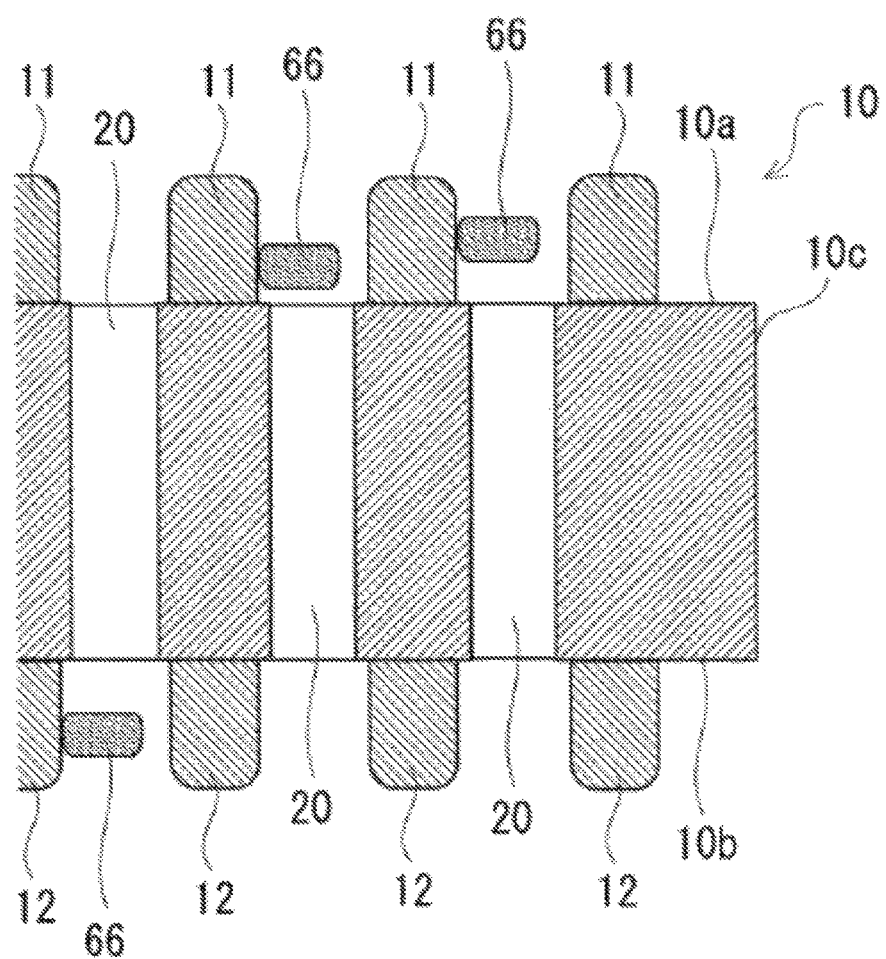
FIG. 11 illustrates a situation in which plating residues adhere between the conductors of coil patterns on the insulated substrate in the embodiment.

If electrolytic plating is repeatedly carried out, residues due to plating may be floating in the plating liquid 60 in the plating bath 61. Therefore, when the insulated substrate 10 is taken out of the plating bath 61, plating residues 66 may adhere between the conductors of the first coil pattern 11 and second coil pattern 12, as illustrated in FIG. 11. If a plating residue 66 is left adhering between the conductors of the first coil pattern 11 and second coil pattern 12, the first coil pattern 11 and second coil pattern 12 may be shorted depending on the size of the plating residue 66, possibly causing a short failure. Since the size of the residue 66 is, for example, only about several micrometers, it is not easy to remove the plating residue 66 from the plating bath 61.

Figure 12:
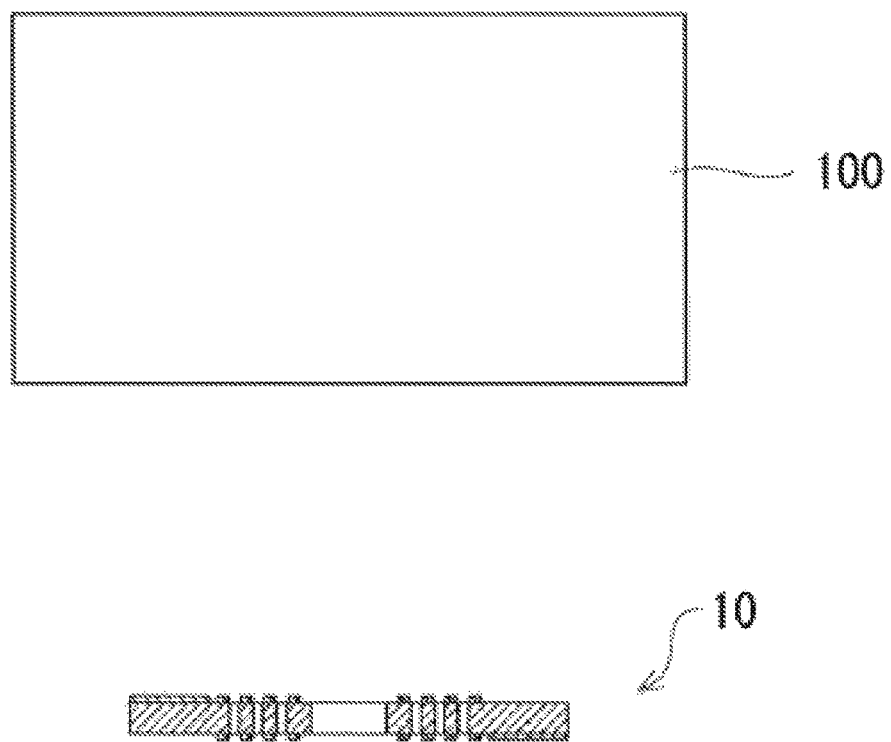
FIG. 12 illustrates a method of detecting whether plating residues are adhering between the conductors of the coil patterns on the insulated substrate in the embodiment.

In this embodiment, therefore, to suppress a short due to the plating residue 66 adhering between the conductors of the first coil pattern 11 and second coil pattern 12, processing to remove the plating residue 66 adhering between the conductors (this processing is called trimming processing) is carried out. Specifically, it is detected whether the plating residue 66 is adhering between the conductors of the first coil pattern 11 and second coil pattern 12 on the insulated substrate 10 that has been subjected to plating processing in the plating bath 61 (S04 in FIG. 5). To detect whether the plating residue 66 is adhering, a detecting device 100 illustrated in FIG. 12, for example, is used. The detecting device 100 may be, for example, an optical device such as an optical microscope. After the insulated substrate 10 has been subjected to plating processing, the insulated substrate 10 may be placed on the stage of, for example, an optical microscope that is commercially available for use in semiconductor inspection, and the first coil pattern 11 and second coil pattern 12 on the insulated substrate 10 may be observed. The optical microscope may include, for example, a camera that captures images of the first coil pattern 11 and second coil pattern 12 at a high magnification ratio (with a precision on a micron or submicron order, for example) as well as a monitor on which images captured by the camera are displayed. Then, based on magnified images, of the first coil pattern 11 and second coil pattern 12, which are displayed on the monitor of the optical microscope, it may be detected whether the plating residue 66 is adhering between the conductors of the first coil pattern 11 and second coil pattern 12. In detection of the adhering plating residue 66, the magnified images of the first coil pattern 11 and second coil pattern 12 may be visually checked. Alternatively, image processing may be performed on the magnified images of the first coil pattern 11 and second coil pattern 12 to detect whether the plating residue 66 is adhering between the conductors of the first coil pattern 11 and second coil pattern 12.

Figure 13:
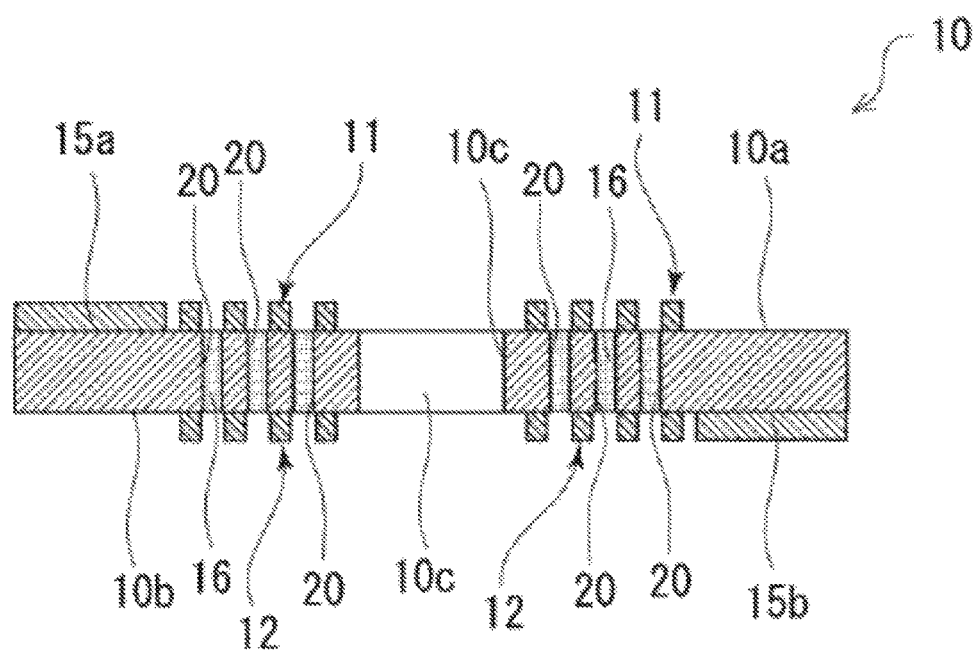
FIG. 13 illustrates another step of manufacturing the inductor in the embodiment.
Figure 14:
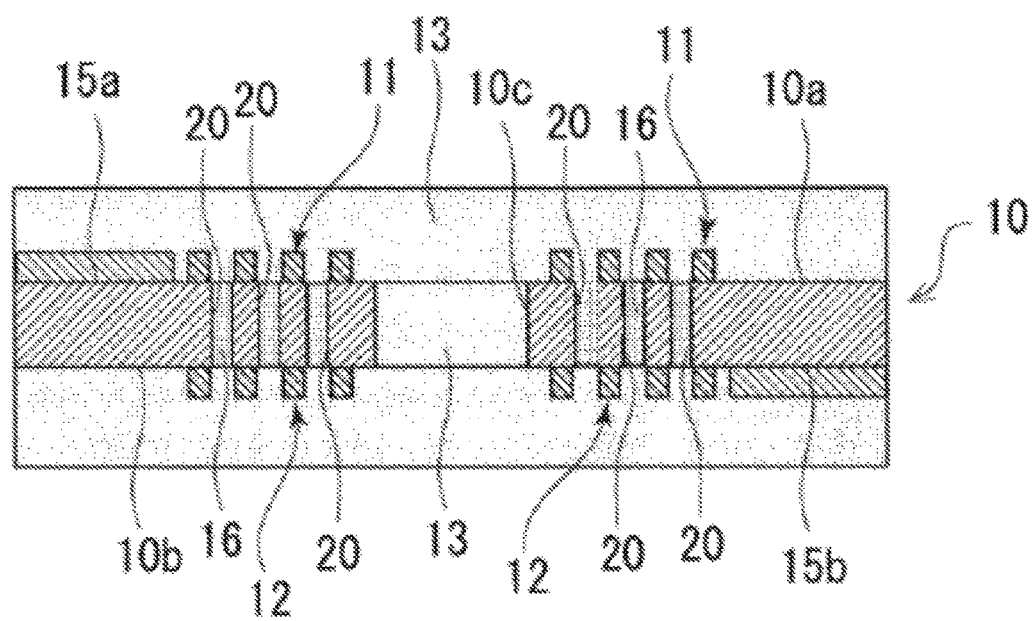
FIG. 14 illustrates another step of manufacturing the inductor in the embodiment.

If the plating residue 66 adhering between the conductors of the first coil pattern 11 and second coil pattern 12 on the insulated substrate 10 is not detected, the trimming through-hole 20 in the insulated substrate 10 is filled with the insulating resin 16 as illustrated in FIG. 13 (S05 in FIG. 5). The insulating resin 16 may be, for example, an epoxy resin. Then, the insulated substrate 10 is covered with the exterior core 13, which includes the magnetic material-containing resin, as illustrated in FIG. 14 (S06 in FIG. 5). The exterior core 13 may be formed by, for example, printing a magnetic material-containing resin paste on the insulated substrate 10 with a printing apparatus (not illustrated) and then heating the paste to cure it. Then, the external electrodes 14a and 14b are formed at both ends of the exterior core 13 (S07 in FIG. 5). As a result, the inductor 1 illustrated in FIGS. 1 and 2 is completed. In the manufacturing of the inductor 1, the trimming through-hole 20 may not be appropriately filled with the insulating resin 16.

Figure 15:
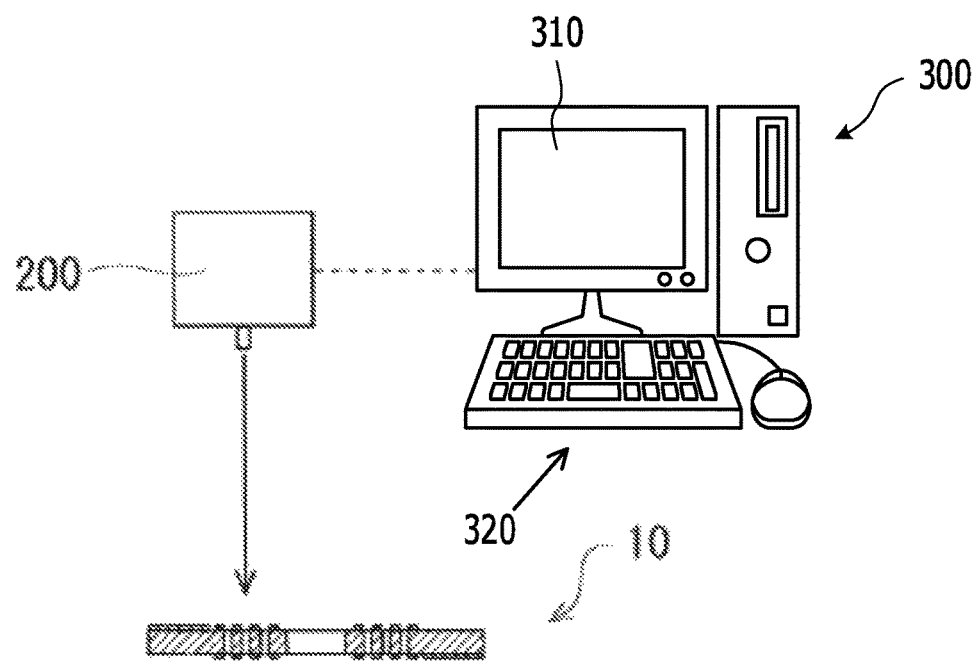
FIG. 15 illustrates a trimming apparatus and a control apparatus in the embodiment.

If the plating residue 66 adhering between the conductors of the first coil pattern 11 and second coil pattern 12 is detected in S04 in FIG. 5, trimming processing is performed to remove the plating residues 66 adhering between the conductors (S08 in FIG. 6). A trimming apparatus 200 illustrated in FIG. 15 is used to perform the trimming processing on the plating residues 66. The trimming apparatus 200 may be, for example, a laser, such as an excimer laser, which emits laser light. The trimming apparatus 200 emits laser light toward the upper surface 10a or lower surface 10b of the insulated substrate 10 placed on a stage (not illustrated).

In this embodiment, the trimming apparatus 200 emits laser light for use in trimming from one end of the spiral shape of the trimming through-hole 20 toward the other end in a single path so as to follow the surface of the trimming through-hole 20. For example, an alignment mark may be provided on the insulated substrate 10, and the alignment mark on the insulated substrate 10 may be detected with a camera (not illustrated) attached to the trimming apparatus 200. To emit laser light along the trimming through-hole 20, the trimming apparatus 200 may emit laser light so that points irradiated with the laser light shift along a predetermined track, starting from the detected alignment mark, which is taken as a reference position. A track of points irradiated with laser light may be set in advance according to the design specifications of the insulated substrate 10. In the course of the shift of the points irradiated with laser light along the trimming through-hole 20, when laser light hits the plating residue 66 adhering to the first coil pattern 11 or second coil pattern 12, the plating residue 66 is separated from the first coil pattern 11 or second coil pattern 12 and drops. Accordingly, the plating residues 66 adhering to the first coil pattern 11 and second coil pattern 12 may be removed from them. When laser light is emitted so as to follow the surface of the trimming through-hole 20, regardless of the number of plating residues 66 adhering to the first coil pattern 11 and second coil pattern 12, these plating residues 66 may be preferably removed. The plating residues 66 removed from the first coil pattern 11 and second coil pattern 12 drop in the trimming through-hole 20 and further drop through the trimming through-hole 20 to the lower portion of the insulated substrate 10.

Next, a relationship between the quality of the inductor 1 and its manufacturing cost will be described according to a frequency at which the plating bath 61 is cleaned. The higher the frequency of the cleaning of the plating bath 61 is, the lower the possibility of the occurrence of a short failure due to the plating residue 66 is. However, the higher the frequency of the cleaning is, the higher a cleaning cost is. So far, the plating bath 61 has been cleaned at intervals of a fixed period or after a predetermined number of insulated substrates 10 had been plated. In these conventional methods, however, it is not easy to maintain a preferable balance between the quality of the inductor 1 and its manufacturing cost. If, for example, the plating bath 61 is excessively often cleaned, the inductor 1 with high quality may be certainly manufactured, but the manufacturing cost is increased. If the plating bath 61 is cleaned at an insufficient frequency, the manufacturing cost of the inductor 1 may be certainly suppressed to a low value, but the quality of the inductor 1 may be lowered. In this embodiment, therefore, times at which to clean the plating bath 61 are determined according to the number of trimmings of the plating residue 66, which are executed during the manufacturing of the inductor 1, as described below in detail.

The reference numeral 300 in FIG. 15 indicates a control apparatus for the trimming apparatus 200. The control apparatus 300 has a counter. Each time the trimming apparatus 200 performs trimming processing on the insulated substrate 10 to remove plating residues 66, the counter increments the number Nt of trimmings by one (S09 in FIG. 6). The control apparatus 300 may be, for example, a general-purpose computer. The control apparatus 300 counts the number Nt of trimmings, for plating residues 66, that were performed starting from a predetermined reference time, and stores that number in a storage device. In addition, in this embodiment, the value of the number Nt of trimmings, which is stored in the control apparatus 300, is reset (returned to 0) each time the plating bath 61 is cleaned. That is, the control apparatus 300 counts the number of times the trimming processing was performed by the trimming apparatus 200 from when the plating bath 61 had been cleaned last.

The control apparatus 300 for the trimming apparatus 200 determines whether the number Nt of trimmings exceeds a predetermined reference number Ntb of trimmings (S10 in FIG. 6). If the control apparatus 300 determines that the number Nt of trimmings exceeds a predetermined reference number Ntb of trimmings (Nt>Ntb), the control apparatus 300 outputs a cleaning request alarm, which requests the plating bath 61 to be cleaned (S11 in FIG. 6). If the control apparatus 300 determines that the number Nt of trimmings is not larger than the predetermined reference number Ntb of trimmings (Nt≤Ntb), the processing proceeds to S05 in FIG. 5. Steps S05 to S07 are as described above.

In this embodiment, the reference number Ntb of trimmings is a threshold to decide whether to clean the plating bath 61; the threshold is an example of a first threshold. If the number Nt of trimmings exceeds the reference number Ntb of trimmings, the control apparatus 300 decides that since many plating residues 66 are included in the plating liquid 60 in the plating bath 61, it is preferable to replace the plating liquid 60 and clean the plating bath 61. If the number Nt of trimmings is not larger than the reference number Ntb of trimmings, the control apparatus 300 decides that since less plating residues 66 are included in the plating liquid 60, the placement of the plating liquid 60 and the cleaning of the plating bath 61 may not be performed immediately. When a cleaning request alarm is output in S11, the plating liquid 60 is replaced and the plating bath 61 is cleaned (S12 in FIG. 6).

The control apparatus 300 may display characters on a display device 310 as the cleaning request alarm. Alternatively, the display device 310 may output a sound alarm from a speaker (not illustrated) as the cleaning request alarm or may use another method of outputting the cleaning request alarm.

Next, the control apparatus 300 calculates a cleaning request output frequency Nf, which is a frequency at which to output a cleaning request alarm (S13 in FIG. 6). The cleaning request output frequency Nf is obtained by, for example, dividing a predetermined reference period by a cleaning request interval, which is a period elapsed from when the control apparatus 300 had output the previous cleaning request alarm until the control apparatus 300 has output the cleaning request alarm this time. Under the condition that the reference period is fixed, the shorter the cleaning request interval is, the larger the cleaning request output frequency Nf is, in which case cleaning request alarms are more often output for the plating bath 61.

The control apparatus 300 decides whether the cleaning request output frequency Nf exceeds a reference cleaning request output frequency Nfb (S14 in FIG. 6). If the control apparatus 300 decides that the cleaning request output frequency Nf exceeds the predetermined reference cleaning request output frequency Nfb (Nf>Nfb), the control apparatus 300 outputs an inspection request alarm, which requests the plating bath 61 to be inspected (S15 in FIG. 6). The control apparatus 300 may display characters on the display device 310 as the inspection request alarm for the plating bath 61 or may output a sound alarm from a speaker. If the control apparatus 300 decides that the cleaning request output frequency Nf is not larger the predetermined reference cleaning request output frequency Nfb (Nf≤Nfb), the processing proceeds to S05 in FIG. 5. S05 and later steps are as described above. In S15, the control apparatus 300 resets the value of the number Nt of trimmings (returns the value to 0).

The reference cleaning request output frequency Nfb is a threshold to decide whether to perform an abnormal condition check to check whether there is an abnormal condition in the plating bath 61; the threshold is an example of a second threshold. If the cleaning request output frequency Nf exceeds the reference cleaning request output frequency Nfb, the control apparatus 300 decides that since cleaning request alarms are frequently output, there is any abnormal condition in the plating bath 61. If the cleaning request output frequency Nf is not larger than the reference cleaning request output frequency Nfb, the control apparatus 300 decides that there is no particular abnormal condition in the plating bath 61. If the control apparatus 300 outputs an inspection request alarm in S15, the plating bath 61 is inspected for an abnormal condition (S16 in FIG. 6). In the inspection of the plating bath 61 for an abnormal condition, the hydrogen-ion exponent (potential hydrogen (pH)) of the plating liquid 60 in the plating bath 61, for example, may be checked to see whether the hydrogen-ion exponent is normal. Upon completion of the inspection of the plating bath 61 for an abnormal condition, the processing proceeds to S05 in FIG. 5. Steps S05 to S07 are as described above.

The method of calculating the cleaning request output frequency Nf is not limited to the example described above. For example, each time an input of a date and time of the cleaning of the plating bath 61 is accepted from an input device 320 such as a keyboard or mouse, the control apparatus 300 may calculate the cleaning request output frequency Nf. In this calculation, the last two dates and times of cleaning are used; a period from the last date and time but one to the last date and time is taken as a cleaning interval. Then, a value obtained by dividing the predetermined reference period by the above cleaning interval may be used as the cleaning request output frequency Nf. Although, in the above embodiment, the control apparatus 300 for the trimming apparatus 200 outputs the cleaning request alarm and inspection request alarm and performs other processing, another computer may execute the processing. In the above steps of manufacturing the inductor 1, plating processing is carried out on the insulated substrate 10 in which the trimming through-hole 20 has been formed, but the trimming through-hole 20 may be formed in the insulated substrate 10 on which plating processing has been carried out.

As described above, in the method of manufacturing the inductor 1 in this embodiment, after the insulated substrate 10 has been electrolytically plated in the plating bath 61, trimming processing is carried out to remove the plating residues 66 adhering to the first coil pattern 11 and second coil pattern 12, in response to the detection of the plating residues 66. When the number Nt of trimmings, which is counted starting from the predetermined reference time, exceeds the reference number Ntb of trimmings, a cleaning request alarm is output for the plating bath 61 to request the plating bath 61 to be cleaned. When information about execution of trimming processing on the plating residue 66 during the manufacturing of the inductor 1 is accumulated as described above, it is possible to directly determine the degree of the plating residues 66 present in the plating liquid 60 in the plating bath 61. It is also possible to monitor the state in which the plating residues 66 are adhering to the first coil pattern 11 and second coil pattern 12 during the manufacturing of the inductor 1. Accordingly, an adequate date and time at which to clean the plating bath 61 may be easily determined. This suppresses the frequency at which to replace the plating liquid 60 and the frequency at which to clean the plating bath 61 from being inadequately determined, and enables the balance between the quality of the inductor 1 and its manufacturing cost to be preferably maintained. Even if the plating residue 66 adheres between the conductors of the first coil pattern 11 and second coil pattern 12 on the insulated substrate 10, the plating residue 66 may be removed by trimming processing as described above. Therefore, short failures in the inductor 1 may be preferably suppressed.

Variation

Figure 16:
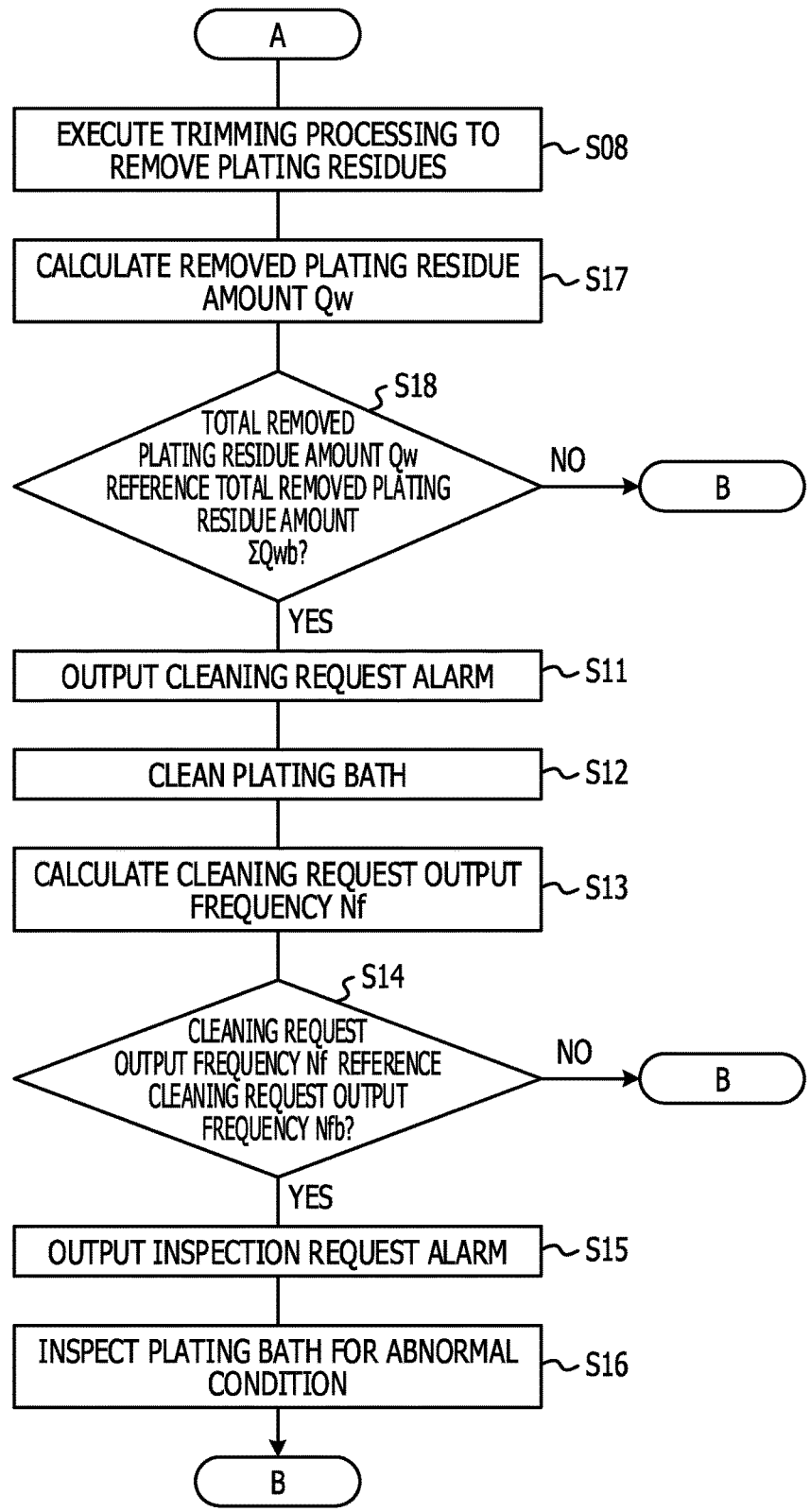
FIG. 16 is a flowchart illustrating steps of manufacturing an inductor in a variation.

Next, a variation of the method of manufacturing the inductor 1 will be described with reference to FIGS. 5 and 16. FIG. 16 is a flowchart illustrating steps of manufacturing the inductor 1 in the variation. In this variation, the inductor 1 is manufactured according to the flowchart in FIG. 16 instead of the flowchart in FIG. 6. In FIG. 16, the same steps as in FIG. 6 are assigned the same step numbers and their detailed description will be omitted here. The steps in FIG. 5 are as described above. If the plating residue 66 adhering between the conductors of the first coil pattern 11 and second coil pattern 12 is detected in S04 in FIG. 5, trimming processing is carried out to remove the plating residue 66 adhering between the conductors of the first coil pattern 11 and second coil pattern 12 (S08 in FIG. 16). Trimming processing to remove the plating residue 66 is as described above with reference to FIG. 6.

Figure 17:
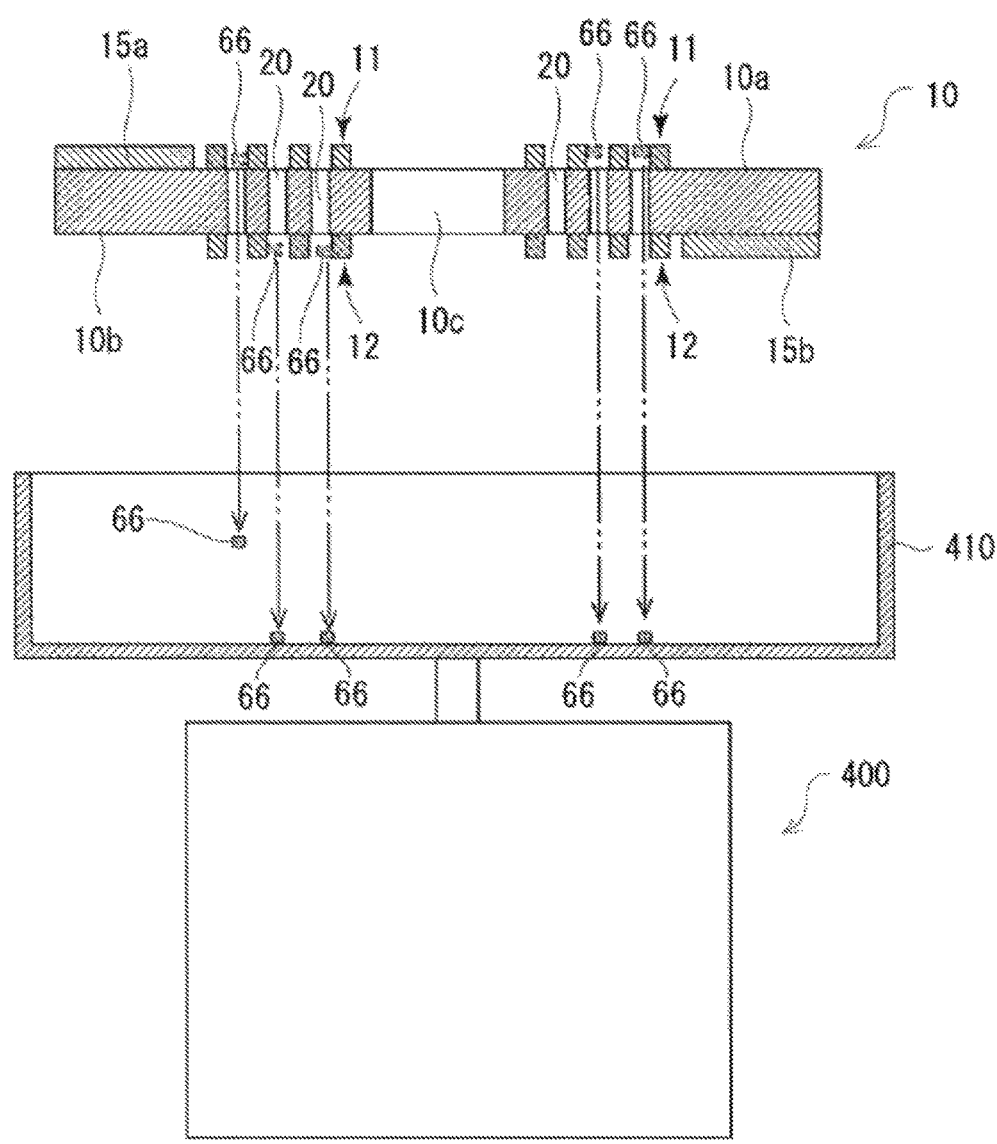
FIG. 17 illustrates a method of measuring the amount of plating residues in trimming processing in the variation.

FIG. 17 illustrates a method of measuring the amount of plating residues 66 in trimming processing in the variation. In this variation, when trimming processing is carried out in S08 in FIG. 16, the amount of plating residues 66 removed from the first coil pattern 11 and second coil pattern 12 on the insulated substrate 10 during the trimming processing is measured (the amount will be referred to below as the removed plating residue amount Qw) (S17 in FIG. 16). In trimming processing, the removed plating residue amount Qw may be measured with a measuring instrument 400 placed below the insulated substrate 10 as illustrated in FIG. 17. A microelectronic balance or the like, for example, may be used as the measuring instrument 400.

The measuring instrument 400 includes a measuring tray 410 that collects (stores) plating residues 66 dropping from the insulated substrate 10 during trimming processing. When the trimming apparatus 200 emits laser light for use in trimming toward the insulated substrate 10, the plating residues 66 adhering to the first coil pattern 11 and second coil pattern 12 on the insulated substrate 10 are separated and removed from the first coil pattern 11 and second coil pattern 12 (see FIG. 17). In the example in FIG. 17, the plating residues 66 adhering to the first coil pattern 11 formed on the upper surface 10a of the insulated substrate 10 drop in the trimming through-hole 20 due to laser trimming. The plating residues 66 pass through the trimming through-hole 20, exit from the lower surface 10b of the insulated substrate 10, and drop below the insulated substrate 10. The plating residues 66 adhering to the second coil pattern 12 formed on the lower surface 10b of the insulated substrate 10 drop below the insulated substrate 10 due to laser trimming. The plating residues 66 that have dropped from the insulated substrate 10 in this way are collected in the measuring tray 410 placed below the insulated substrate 10. The measuring instrument 400 may measure the removed plating residue amount Qw by measuring the weight of the plating residues 66 collected in the measuring tray 410.

The measuring instrument 400 is wired to, for example, the control apparatus 300. The control apparatus 300 obtains, from the measuring instrument 400, the removed plating residue amount Qw measured by the measuring instrument 400 and calculates a total removed plating residue amount $\Sigma Qw$ collected in a period from a predetermined reference time to the current time. The control apparatus 300 then decides whether the total removed plating residue amount $\Sigma Qw$ exceeds a predetermined reference total removed plating residue amount $\Sigma Qwb$ (S18 in FIG. 16). Each time the trimming apparatus 200 performs trimming processing once, the measuring instrument 400 outputs, to the control apparatus 300, the amount of plating residues 66 removed from the first coil pattern 11 and second coil pattern 12 on the insulated substrate 10 that has been subjected to trimming processing, as the removed plating residue amount Qw. That is, the removed plating residue amount Qw is the weight of plating residues 66 removed in one execution of trimming processing.

Each time the trimming apparatus 200 executes trimming processing once, the control apparatus 300 obtains the removed plating residue amount Qw from the measuring instrument 400. Each time the control apparatus 300 obtains a new removed plating residue amount Qw from the measuring instrument 400, the measuring instrument 400 totals removed plating residue amounts Qw obtained in a period from the predetermined reference time to the current time and stores the resulting total in a storage device as the total removed plating residue amount $\Sigma Qw$. An example of the predetermined reference time may be a date and time of the previous cleaning of the plating bath 61. In this variation, the total removed plating residue amount $\Sigma Qw$ stored in the storage device of the control apparatus 300 is reset (returned to 0) each time the plating bath 61 is cleaned.

If the control apparatus 300 decides in S18 in FIG. 16 that the total removed plating residue amount $\Sigma Qw$ exceeds the reference total removed plating residue amount $\Sigma Qwb$ ($\Sigma Qw > \Sigma Qwb$), the control apparatus 300 outputs a cleaning request alarm for the plating bath 61 (S11 in FIG. 16). If the control apparatus 300 decides in S18 that the total removed plating residue amount $\Sigma Qw$ is not larger than the reference total removed plating residue amount $\Sigma Qwb$ ($\Sigma Qw \leq \Sigma Qwb$), the processing proceeds to S05 in FIG. 5. Steps S05 to S07 are as described above.

The reference total removed plating residue amount $\Sigma Qwb$ is a threshold related to the total removed plating residue amount $\Sigma Qw$, the threshold being used to decide whether to clean the plating bath 61; the threshold is an example of a first threshold. If the total removed plating residue amount ΣQw exceeds the reference total removed plating residue amount ΣQwb, the control apparatus 300 decides that since relatively many plating residues 66 are included in the plating liquid 60 in the plating bath 61, it is preferable to replace the plating liquid 60 and clean the plating bath 61. If the total removed plating residue amount ΣQw is not larger than the reference total removed plating residue amount ΣQwb, the control apparatus 300 decides that since relatively less plating residues 66 are included in the plating liquid 60, the placement of the plating liquid 60 and the cleaning of the plating bath 61 may not be performed immediately. When a cleaning request alarm is output in S11 in FIG. 16, the plating liquid 60 is replaced and the plating bath 61 is cleaned (S12 in FIG. 16). Subsequent steps S13 to S16 are as described above. In S15 in this variation, the control apparatus 300 resets the value of the total removed plating residue amount ΣQw (returns the value to 0). After the plating bath 61 has been inspected for an abnormal condition in S16, the processing proceeds to S05 in FIG. 5 and steps from S05 to S07 are executed.

In this variation described above, to determine a time at which to clean the plating bath 61, a cleaning request alarm for the plating bath 61 has been output according to the total removed plating residue amount ΣQw instead of the number Nt of trimmings performed for plating residues 66 during the manufacturing of the inductor 1. Since the removed plating residue amount Qw is the amount of plating residues 66 removed in one execution of trimming processing, the removed plating residue amount Qw accurately indicates the number of plating residues 66 that actually adhered to the insulated substrate 10, their weight, and the like. Therefore, the total removed plating residue amount ΣQw obtained by totaling removed plating residue amounts Qw in a period from the previous cleaning of the plating bath 61 to the current time could be described as a parameter that more accurately indicates the amount of plating residues 66 included in the plating liquid 60 in the plating bath 61. In this variation, therefore, it is possible to more precisely determine the degree of plating residues 66 present in the plating liquid 60 in the plating bath 61. As a result, the frequency at which to replace the plating liquid 60 in the plating bath 61, that is, to clean the plating bath 61, may be adequately determined, and the balance between the quality of the inductor 1 and its manufacturing cost may be preferably maintained.

This completes the descriptions of the method of manufacturing the inductor 1 in the above embodiment and variation. It will be understood by those skilled in the art that the above embodiment and variation may be modified, improved, and combined in various ways. For example, although, in the above embodiment, the first coil pattern 11 and second coil pattern 12 have been formed on both surfaces of the insulated substrate 10, a coil pattern may be formed only on one surface. Although, in the above embodiment, the trimming through-hole 20 formed in the insulated substrate 10 has been spiral, this is not a limitation; for example, a plurality of through-holes may be formed discontinuously in directions in which the first coil pattern 11 and second coil pattern 12 on the insulated substrate 10 extend. The inductor 1 is preferably applied to a mobile telephone, a smart phone, a tablet PC, or another mobile device. However, the inductor 1 may be applied to other various electronic devices without being limited to these mobile devices.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A method of manufacturing an inductor, comprising:
   forming a coil pattern on a substrate by forming a conductive pattern on the substrate then growing the conductive pattern by plating using a plating path;
   determining if a plating residue from the plating bath is adhering to the coil pattern, wherein the plating residue is removed from the coil pattern if it is determined that the plating residue is adhering to the coil pattern; and
   outputting a cleaning request alarm that requests the plating bath to be cleaned if a number of times the plating residue has been removed from the coil pattern or an amount of plating residue that has been removed from the coil pattern exceeds a first threshold.

2. The method according to claim 1, further comprising cleaning the plating bath when the cleaning request alarm is output.

3. The method according to claim 1, further comprising issuing an inspection request alarm that requests the plating bath to be inspected if a frequency at which the cleaning request alarm is output exceeds a second threshold.

4. The method according to claim 1, further comprising providing a through-hole between adjacent conductors of coil patterns, the through-hole passing through the substrate in a thickness direction of the substrate,
   wherein in the removing, the plating residue adhering to the coil pattern is dropped into the through-hole.

5. The method according to claim 4, wherein the through-hole is formed along the coil pattern.

* * * * *